United States Patent
Roy

(10) Patent No.: US 9,310,784 B1
(45) Date of Patent: Apr. 12, 2016

(54) SENSOR SYSTEM FOR MONITORING DATA CENTER EQUIPMENT

(71) Applicant: Google Inc., Mountain View, CA (US)

(72) Inventor: Richard Stuart Roy, Santa Clara, CA (US)

(73) Assignee: Google Inc., Mountain View, CA (US)

( * ) Notice: Subject to any disclaimer, the term of this patent is extended or adjusted under 35 U.S.C. 154(b) by 546 days.

(21) Appl. No.: 13/721,763

(22) Filed: Dec. 20, 2012

(51) Int. Cl.
- G05B 13/00 (2006.01)
- G05B 13/02 (2006.01)
- H04L 12/40 (2006.01)
- H05K 7/20 (2006.01)

(52) U.S. Cl.
CPC ............... G05B 13/02 (2013.01); H04L 12/40 (2013.01); H05K 7/20709 (2013.01); H04L 2012/4026 (2013.01)

(58) Field of Classification Search
None
See application file for complete search history.

(56) References Cited

U.S. PATENT DOCUMENTS

| | | | | |
|---|---|---|---|---|
| 6,163,823 | A * | 12/2000 | Henrikson | 710/100 |
| 6,529,127 | B2 * | 3/2003 | Townsend et al. | 340/505 |
| 7,774,511 | B2 * | 8/2010 | Zatelman et al. | 710/9 |
| 8,160,838 | B2 * | 4/2012 | Ramin et al. | 702/188 |
| 8,854,822 | B2 * | 10/2014 | Hazzard et al. | 361/724 |
| 2003/0046339 | A1 * | 3/2003 | Ip | 709/203 |
| 2005/0286220 | A1 * | 12/2005 | Moore et al. | 361/687 |
| 2006/0162364 | A1 * | 7/2006 | Felcman et al. | 62/259.2 |
| 2008/0269932 | A1 * | 10/2008 | Chardon et al. | 700/98 |
| 2012/0039319 | A1 * | 2/2012 | Moore et al. | 370/338 |
| 2013/0293157 | A1 * | 11/2013 | Shea et al. | 315/312 |

OTHER PUBLICATIONS

Midon design, 1-wire application guide v1.03, Aug. 9, 2009.*
1-Wire Digital Thermometer With Sequence Detect and PIO, Maxim Integrated Products, Apr. 2009, 29 pages.

* cited by examiner

*Primary Examiner* — Christopher E Everett
(74) *Attorney, Agent, or Firm* — Lerner, David, Littenberg, Krumholz & Mentlik, LLP

(57) ABSTRACT

A method and apparatus are provided for monitoring the thermal state of a data center. According to the method and apparatus, thermal sensors are placed at various locations in a data center and readings from those sensors are collected. Once collected, the readings are used in controlling the operation of the data center.

20 Claims, 21 Drawing Sheets

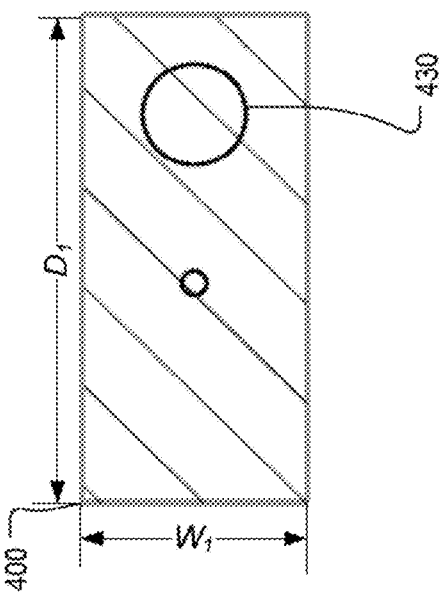
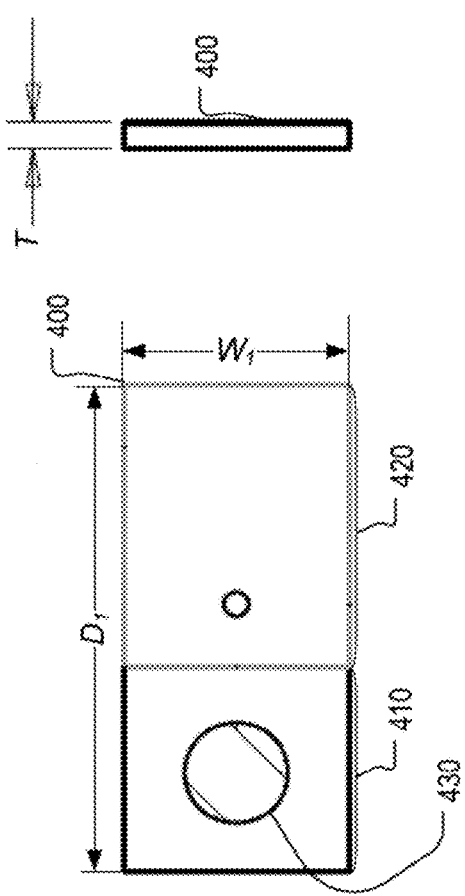
Fig. 4A    Fig. 4B    Fig. 4C

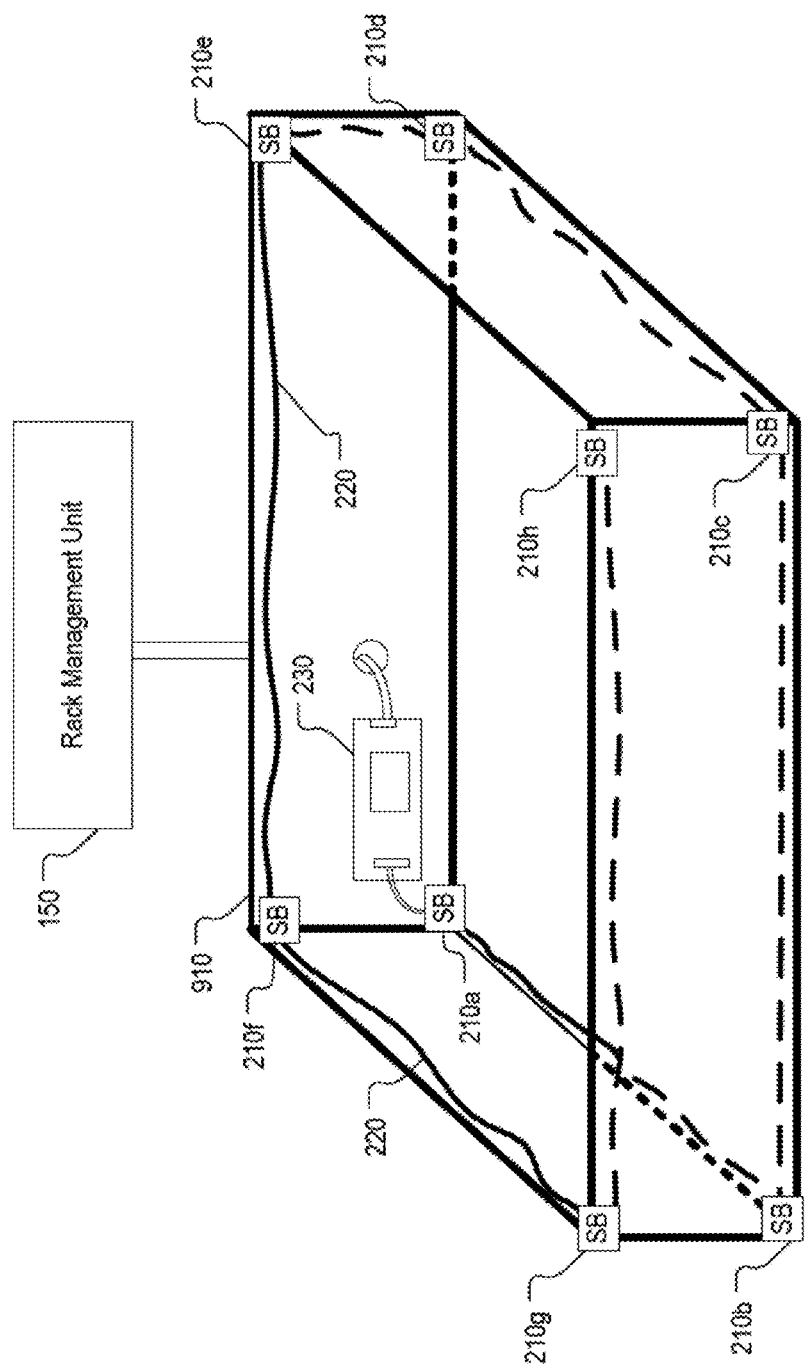

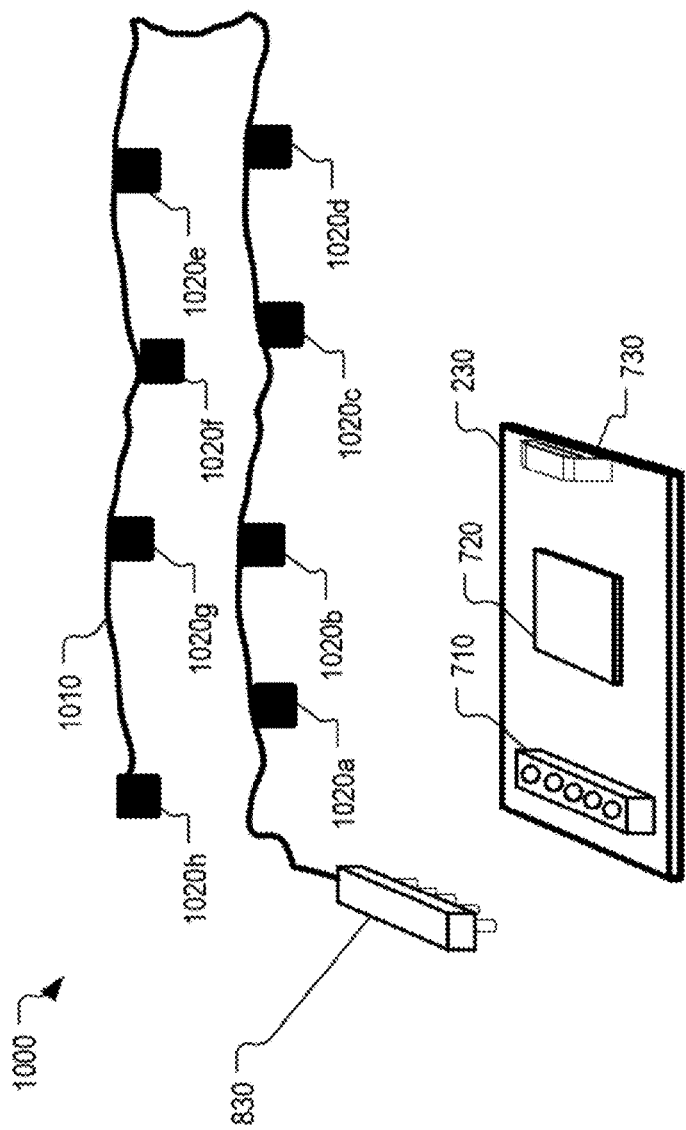

| Temperature | Coordinates |
|---|---|
| 28C | $X_1, Y_1, Z_1$ |
| 31C | $X_2, Y_2, Z_2$ |
| 34C | |
| . | . |
| . | . |
| 31C | $X_{a-1}, Y_{a-1}, Z_{a-1}$ |
| 26C | $X_a, Y_a, Z_a$ |

SENSOR SYSTEM FOR MONITORING DATA CENTER EQUIPMENT

BACKGROUND

Data centers house servers and other communications equipment. Data centers generate large quantities of heat over the course of their operation and this heat builds up in patterns that are difficult to predict. Such patterns may depend on air currents, server loads, and many other factors. Due to the large number of variables that affect the building up of heat, using purely analytical methods to model the thermodynamic behavior of data centers may be complex and computationally expensive. On the other hand, having precise knowledge of the manner in which heat accumulates may be valuable with respect to managing the data centers' operation. For example, it could reveal "hot" spots in the data centers where heat is trapped and server equipment is put at a risk of overheating.

SUMMARY

In one aspect, a method and apparatus are provided for monitoring the thermal state of a data center. According to the method and apparatus, thermal sensors may be placed at various locations in a data center and readings taken by those sensors may be collected. The readings may be used to identify hot spots in the data center where heat is building up as well as cold spots that might be overcooled. Afterwards, the amount of cooling supplied to the cold spots may be reduced while the amount of cooling supplied to the hot spots is increased.

In another aspect, a data center is provided that includes a control device configured to monitor one or more devices, a sensor control board operatively connected to the control device, a device enclosure for the one or more control devices, and a plurality of sensor boards connected to the sensor control board. The control device is configured to monitor temperatures of one or more devices in the data center. The plurality of sensor boards is disposed within the device enclosure and connected to the sensor control board. The sensor boards in the plurality are connected in series to one another using a single run of cable. The sensor control board is configured to receive temperature readings from the plurality of sensor boards and forward those readings to the control device.

The one or more devices may further include at least one of a server, a battery backup system, or a power distribution board. The sensor control board may further be disposed inside the device enclosure. The data center may further include a server rack and the one or more devices may be housed in the server rack. The control device may further include a rack management unit. The control device may further include a management system. Each one of the sensor boards may further include a substrate base that is less than 1.5 mm thick, thereby causing the sensor board to have a low thermal mass.

In yet another aspect, a system for monitoring the temperature of data center equipment is provided. The system includes a control device, a cable, a plurality of sensor boards, and a sensor control board. The sensor boards in the plurality are connected in series to one another via the cable. The sensor boards are spaced apart from one another, along the cable, in a pattern that depends on distances between positions in a device enclosure that are designated for mounting of the sensor boards. The sensor control board includes a memory and a processor. The memory is configured to store indications of locations where the sensor boards are mounted. The processor is configured to receive temperature readings from the plurality of sensor boards and forward the temperature readings to the control device along with an indication of location, for each sensor reading, that corresponds to a location of a sensor that took that reading.

Each one of the sensor boards may further include a substrate base that is less than 1.5 mm thick, thereby causing the sensor board to have a low thermal mass. The cable may further be soldered onto the sensor boards. The cable may further include a plurality of wires, each wire being coupled to only two sensor boards from the plurality. The locations where the sensor boards are mounted may further be entered as user input into the sensor control board. Forwarding the temperature readings to the recipient device may further include identifying, for each of the sensor readings, a location where a sensor board that took the reading is mounted.

In yet another aspect, a system is provided that includes a sensor control board coupled to a plurality of sensor boards. The sensor control board and the plurality of sensor boards are connected in series to one another via a single cable. The cable includes a jacket, a plurality of connectors. A first wire is disposed within the jacket and coupled to all connectors in the plurality of connectors, the first wire being used as a data bus for the exchange of data between the sensor control board and the plurality of sensor boards. A second wire is disposed within the jacket and coupled to only two connectors from the plurality of connectors. The second wire is coupled to a first one from the plurality of connectors and a second one from the plurality of connectors. The first one of the plurality of connectors is configured to mate with a first sensor board and transfer a signal that is output by the first sensor board onto the second wire. The second one of the plurality of connectors is configured to mate with a second sensor board. The signal is a signal that enables a registration of the second one of the plurality of sensor boards with the sensor control board.

The cable may further include a plurality of wires disposed within the jacket. The plurality of wires may be different from the first wire and the second wire. Each one of the plurality of wires may further be coupled to only two connectors from the plurality. Each one of the plurality of sensor boards may further include a thermal sensor. At least one of the plurality of sensor boards may further include a substrate base that is less than 1.5 mm thick, thereby enabling the sensor board to have a low thermal mass. The sensor control board may further be configured to receive temperature readings from the plurality of sensor boards. The sensor control board may further be configured to store an indication of a location where at least one of the sensor boards is mounted. The sensor control board may further be configured to receive temperature readings from a sensor board in the plurality, store in a memory an indication of a location where the sensor board is mounted, and transmit the temperature reading and the indication of location to a control device.

BRIEF DESCRIPTION OF THE DRAWINGS

FIGS. 4A-C depicts schematic diagrams of a substrate base which the circuit of FIG. 3 may be mounted on.

FIG. 9 depicts a schematic diagram of an equipment enclosure with the sensor array of FIG. 2B installed in the equipment enclosure.

FIG. 10 depicts a schematic diagram of another sensor array in accordance with aspects of the disclosure.

FIG. 18 depicts a tabular representation of a thermal map.

DETAILED DESCRIPTION

Figure 1:
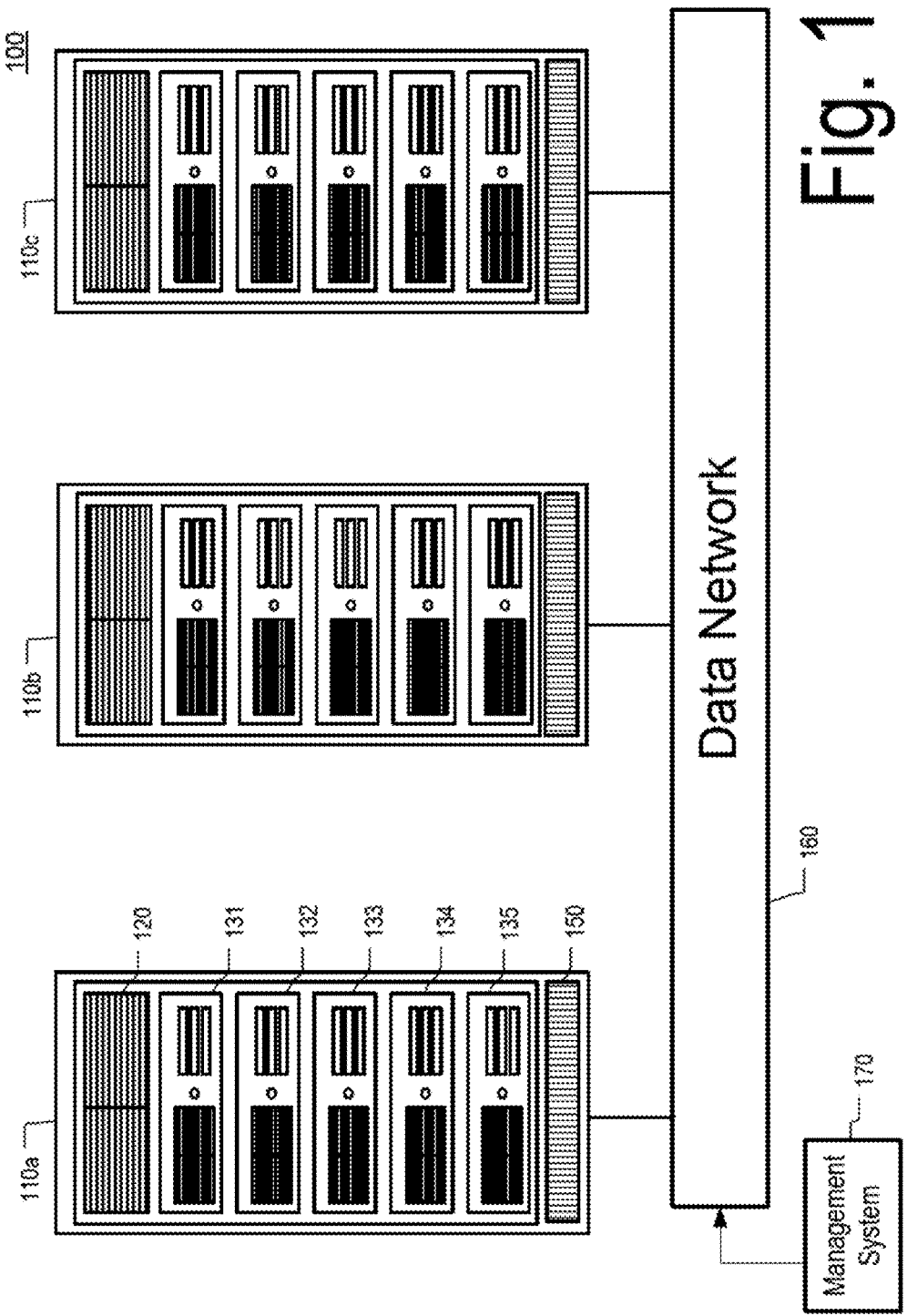
FIG. 1 depicts a schematic diagram of a data center in accordance with aspects of the disclosure.

FIG. 1 depicts a schematic diagram of a data center 100 in accordance with aspects of the disclosure. The data center 100 may include server racks 110a-c, management system 170, and a communications network 160. The server rack 110a may contain cooling devices 120, servers 131-135, and a rack control unit 150. The cooling device 120 may be an air cooling system, a water cooling system, or any other system capable of controlling the temperature of equipment installed in the server rack 110a. The servers 131-135 may be computers including processors, memory, and other hardware typically found in computer equipment. The rack control unit 150 may comprise one or more processors, memory, and other hardware typically found in processor-based devices. The rack control unit 150 may include software and hardware for controlling the various aspects of the operation of the server rack 110a. In one aspect, the rack control unit 150 may receive temperature readings from the sensors that are installed in the enclosures in the servers 131-135 and adjust the operation of the cooling device 120 based on the temperature readings Alternatively, the rack management unit 150 may forward the temperature readings to a management system 170.

The management system 170 may be a computing device comprising a processor, memory, as well as other components typically found in computer equipment. The management system 170 may include hardware and software for controlling the operation of the data center 100. For instance, the management system 170 may receive temperature readings from thermal sensors located in one or more devices that are part of the data center 100 and adjust the operation of cooling systems, battery backup systems, lighting systems or any other type of system that is part of the data center 100 based on those readings. The management system 170 may be operatively coupled, via the communications network 160, to the rack management unit 150. The communications network 160 may include an Ethernet, TCP/IP, InfiniBand, or any other type of data network.

In operation, the management system 170 may receive temperature readings from sensor arrays located in the data center equipment, and generate control signals based on the temperature readings. The control signals may be signals changing the state (e.g., setting the operation) of a cooling unit, battery back-up system, server, or any other piece of data center equipment that is part of the data center 100. For example, the control signals may increase the amount of cooling provided by an air conditioner or decrease the rate at which a cooling fan spins. In some aspects, at least some of the functions of the rack management unit 150 and management system 170 may be redundant. However, unlike the rack management unit 150, the management system 170 may be responsible for controlling a plurality of server racks and it may receive sensor readings from all server racks in the plurality. The management system 170 may thus generate the control signals based on a larger set of information (e.g., sensor signals from all server racks) than the rack management unit 150.

Figure 2A:
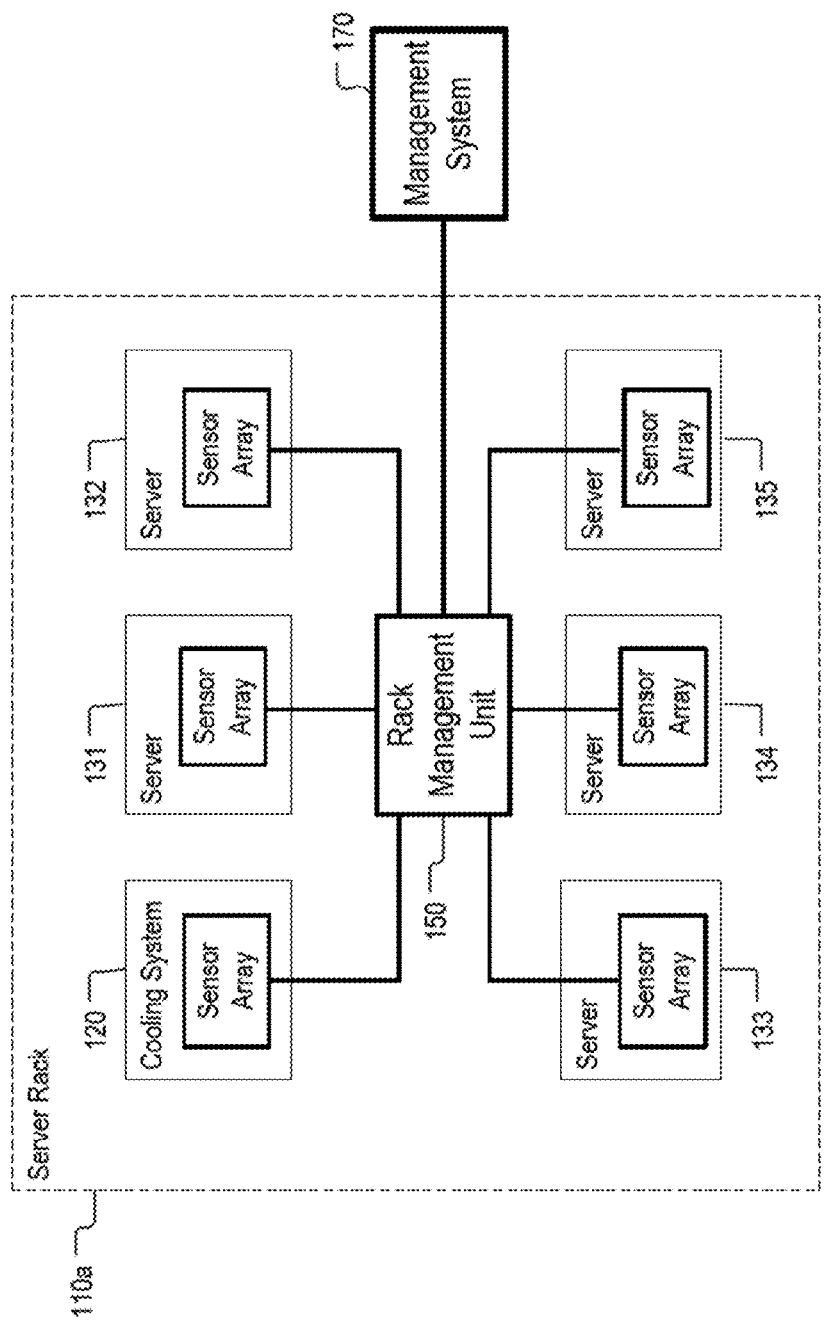
FIG. 2A depicts a schematic diagram of a system that is used to monitor the temperature of various devices in the data center of FIG. 1
Figure 2B:
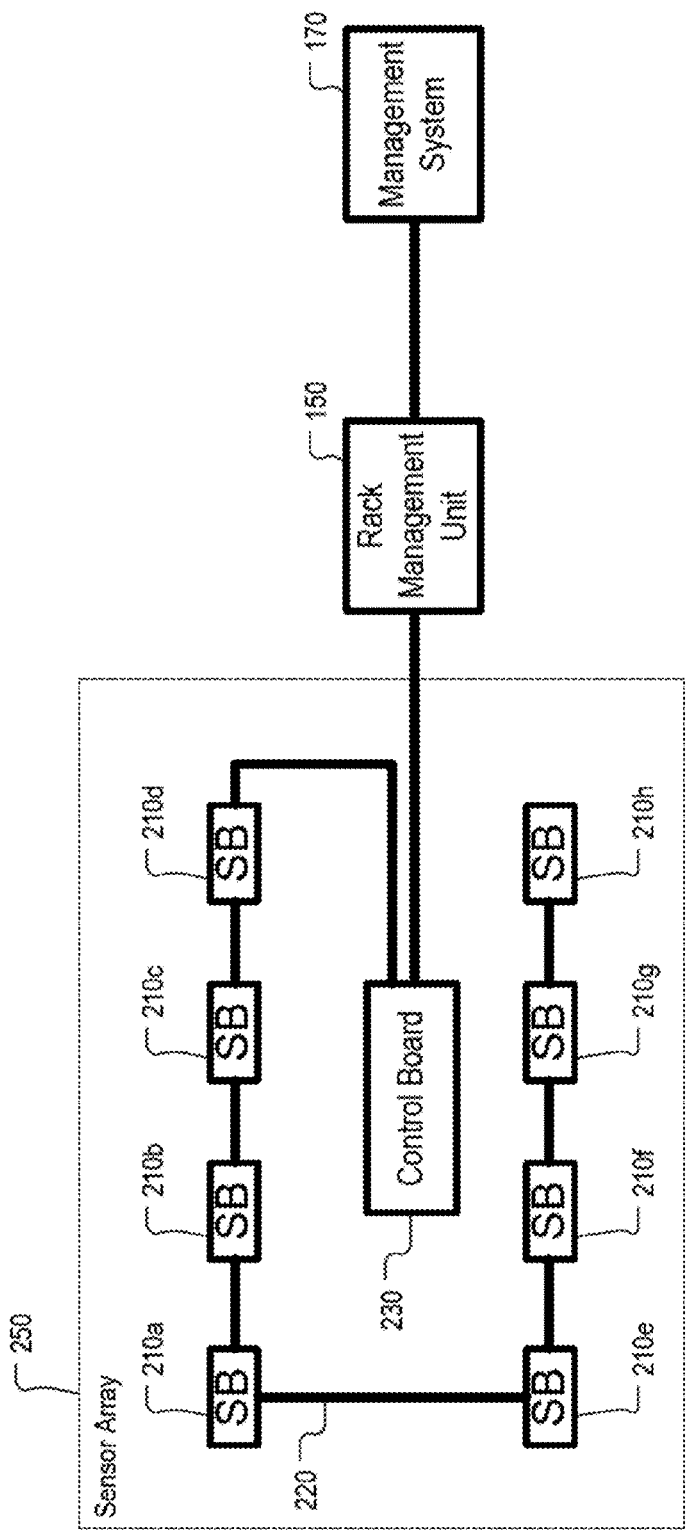
FIG. 2B depicts a schematic diagram of a sensor array that may be used to monitor at least one device in the data center.

Although in this example a hierarchical control system is used that includes both rack management units and a management system, in other examples, the operations of various devices (e.g., cooling devices, battery backup systems) in the data center 100 may be controlled by the management system 170. In such instances, sensor readings may be passed (by a control board) directly to the management system 170 without passing through a rack management unit or another intermediary FIG. 2A depicts a schematic diagram of a system that is used to monitor the temperature of various devices in the server rack 110a in accordance with aspects of the disclosure. In this example, each of the devices housed in the server rack 110 is outfitted with a sensor array that is operatively connected to the rack management unit 150. FIG. 2B depicts a schematic diagram of a sensor array 250 that may be installed in the enclosure of the server 131. The sensor array 250 may include sensor boards 210a-h that are wired in a linear network to one another. The sensor boards may be connected to one another via a cable assembly 220. The control board 230 may include a microcontroller, memory, an interface for connecting to one or more of the sensor boards 210a-h (e.g., JTAG or I2C), and an interface for connecting to the rack management unit 150. The control board 230 may be connected to the sensors 210a-h, via the cable assembly 220. Furthermore the control board 230 may be connected to the rack management unit 150 via a parallel, serial, or USB or network (e.g., TCP/IP or Ethernet) connection. The structure control board 230 is further discussed with respect to FIG. 7.

Figure 3:
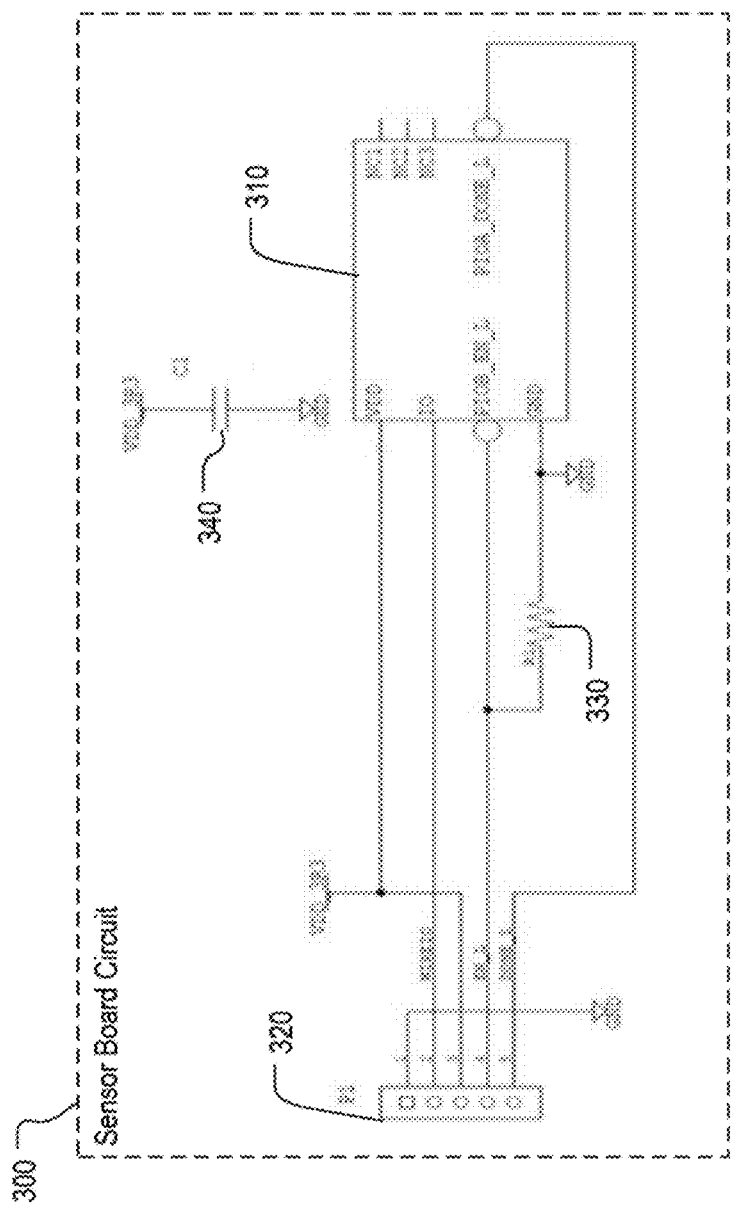
FIG. 3 depicts a schematic diagram of a circuit that may be implemented by a sensor board.

FIG. 3 depicts a diagram of a circuit 300 that may be implemented by each one of the sensor boards 210a-h. The circuit 300 may include a sensor 310, a connector 320, a pull down resistor 330, and a bypass capacitor 340. The sensor 310 may be a digital thermometer, such as the DS28EA00 digital thermometer manufactured by MAXIM Inc. of Sunnyvale, Calif. The sensor may include eight pins labeled, VDD, IO, PIOB, GND, NC1, NC2, NC3, and PIOA. The VDD and GND pins may be power supply and ground, respectively.

The IO pin may be used for data input and output and the PIOB and PIOA pins may be used to receive and transmit signals related to the discovery of sensor boards by a control board. The discovery process if further discussed with respect to FIG. 8A.

The connector 320 may include contact surfaces 1-5 coupled to different pins of the sensor 310. Contact surface 1 may be coupled to the GND pin, contact surface 2 may be coupled to the IO pin, contact surface 3 may be coupled to the VDD pin, contact surface 4 may be coupled to the PIOB pin, and contact surface 5 may be coupled to the PIOA pin of the sensor 310. The resistor 330 may be used to keep the line fed to the PIOB stable when the circuit 300 is used on the first device in a chain (e.g., the sensor board 210a), but it may not be used later in the chain. The capacitor 340 may be a 0.1 uF capacitor, and it may be used to stabilize the power supply to the sensor 310.

FIGS. 4A-C depict diagrams of a substrate base 400 that the circuit 300 may be mounted on. FIG. 4A shows a top view of the base, FIG. 4B shows a side view of the base, and FIG. 4C shows a bottom view of the base. The base 400 may be shaped as a rectangle having width W, length L, and thickness T. The width W may be in the range of 5 mm-10 mm, the length L may be in the range of 5-20 mm, and the thickness T may be in the range 0.2-1.5 mm. The base 400 may include portions 410 and 420 where the portion 410 includes a mounting hole and the portion 420 may be a foundation where the circuit 300 is mounted. The portions 410 and 420 may be made from the same material (e.g. FR-4 PCB) or from different types of material. In some instances, the base 400 may include a latch or another type of fastener for attaching the base 400 to mounting surfaces. In other instances, the base 400 may include only the portion 420.

Figure 6:
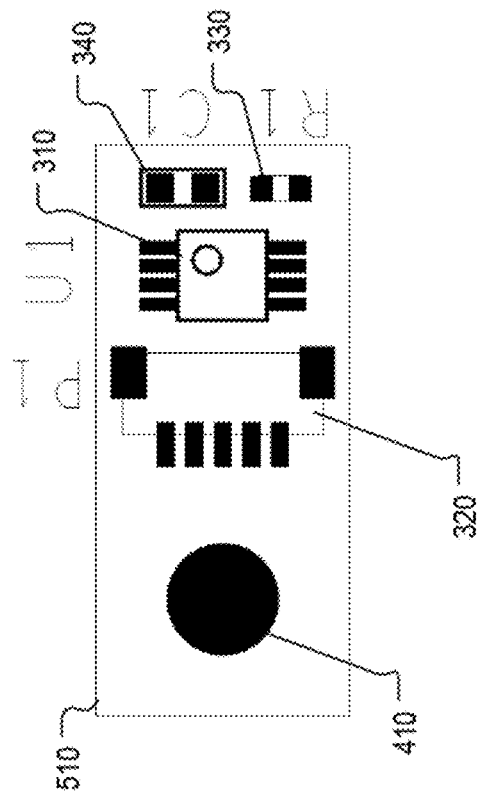
FIG. 6 depicts a schematic diagram of the layout of the sensor board of FIG. 5.
Figure 5:
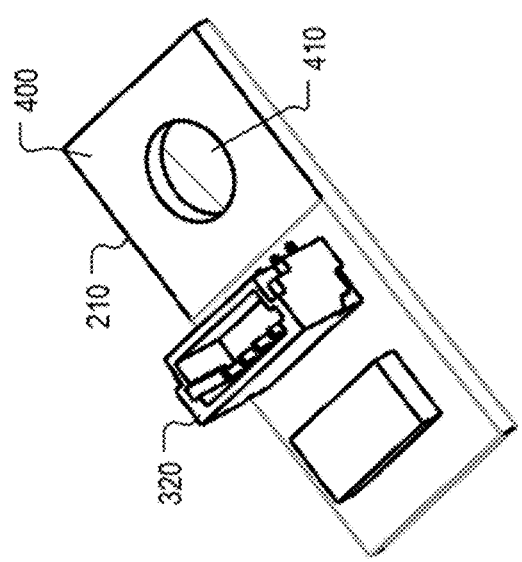
FIG. 5 depicts a perspective three-dimensional view of a sensor board that includes the circuit of FIG. 3 and the substrate base of FIG. 4.

FIG. 5 depicts a perspective three-dimensional view of a sensor board 210 that includes the circuit 300 and the base 400. Each of the sensor boards 210a-h may have a structure identical to the sensor board 210. FIG. 6 depicts a schematic diagram showing the layout of the sensor board 210. As illustrated, the board 210 may consist of a very few components mounted on a thin film. Having a small number of components and a thin substrate base may result in the sensor board 210 having a low thermal mass. The low thermal mass may increase the accuracy of the sensor board 210 and cause it to be more sensitive to changes in temperature.

Figure 7:
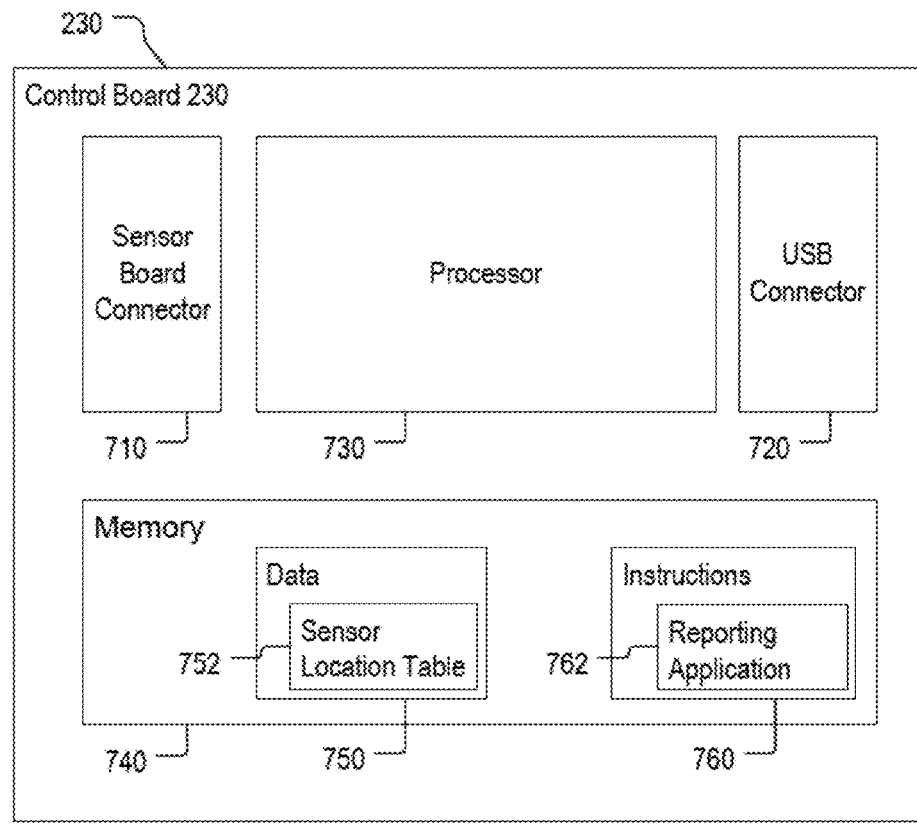
FIG. 7 depicts a schematic diagram of a control board.

FIG. 7 depicts a schematic diagram 700 of the control board 230. As illustrated, the control board may include sensor board connector 710, USB connector 720, processor 730, and memory 740. Connector 710 may be any type of cable connector, such as connector part number BM05B-SRSS-TB manufactured by JSB. Connector 720 may be a USB, RJ45 or any other type of connector. The processor 730 may be any well-known processor, such as commercially available processors. Alternatively, the processor may be a dedicated controller such as an ASIC. Memory 740 may be any volatile or non-non volatile, write-capable or read-only memory, such as RAM, DRAM, CD-ROM, hard-drive, or SSD drive. The memory 740 may store information accessible by processor 730, including data 750 and instructions 760 that may be executed by the processor 730.

Figure 16:
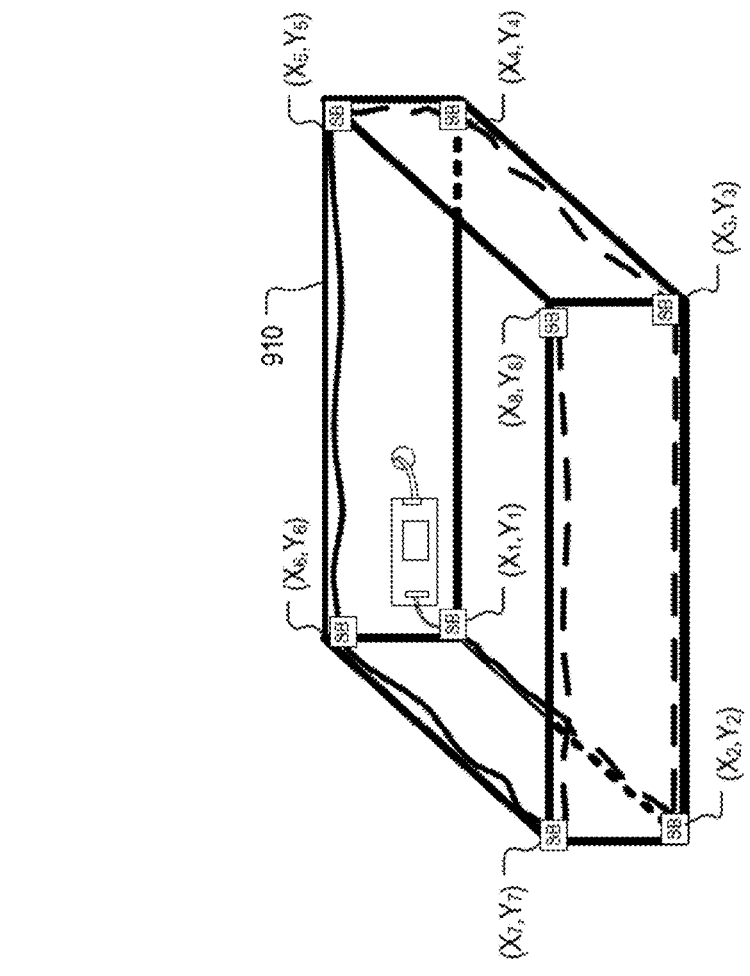
FIG. 16 depicts an example of a table that may be used to store the locations where sensor boards are installed

The data 750 may be retrieved, manipulated or stored by the processor in accordance with the instructions 760. For instance, although the system and method is not limited by any particular data structure, the data may be stored in computer registers, in a relational database as a table having a plurality of different fields and records, or XML documents. The data may also be formatted in any computer-readable format such as, but not limited to, binary values, ASCII or Unicode. Moreover, the data may comprise any information sufficient to identify the relevant information, such as numbers, descriptive text, proprietary codes, pointers, references to data stored in other memories (including other network locations) or information that is used by a function to calculate the relevant data. Data 750 may include a table 752 having a plurality of rows wherein each row relates a sensor in the sensor array 250 to a location where the sensor is installed. The content of the table 752 is further discussed with respect to FIG. 16. Table 752 may be stored as database table, text file, data file, or as any other type of data representation. Although in this example, the table 752 is stored in the memory of the control board 230, in other examples, the table 752 may be stored in the memory of management system 170 or elsewhere.

The instructions 760 may be any set of instructions to be executed directly (such as machine code) or indirectly (such as scripts) by the processor. In that regard, the terms "instructions," "steps" and "programs" may be used interchangeably herein. The instructions may be stored in object code format for direct processing by the processor, or in any other computer language including scripts or collections of independent source code modules that are interpreted on demand or compiled in advance. The instructions 760 may include a reporting application or logic 762 for reporting temperature readings taken by the sensors in the sensor array 250 to the rack management unit 150 or the managing system 170. Although in this example, the logic 762 is implemented in software, in other examples, it may be implemented in hardware (e.g., on the processor 730), or as a combination of software and hardware.

Figure 8A:
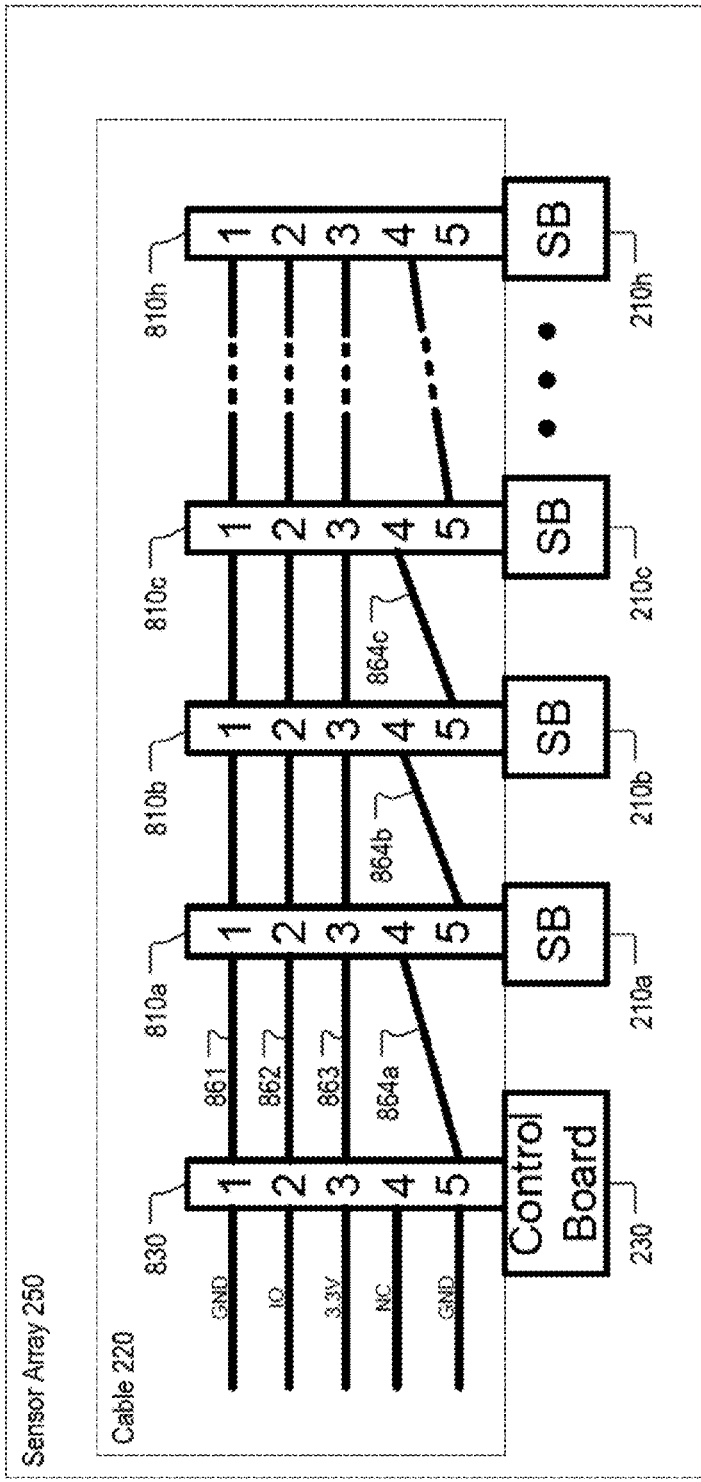
FIG. 8A depicts another schematic diagram of the sensor array of FIG. 2B.

FIG. 8A depicts a schematic diagram of the sensor array 250 in accordance with another aspect of the disclosure. In this example, the cable assembly 220 includes a control board connector 830, sensor board connectors 810a-h, and wires 861, 862, 863, and 864a-c. The connector 830 may have 5 contact surfaces numbered 1 though 5, respectively and it may be connected to the control board 230. Each one of the connectors 810a-h may also have five contact surfaces numbered through 5, respectively. The connectors 810a-h may be connected to the sensor boards 210a-h. Furthermore, the connectors 810a-h may be connected in series to one another, and to the connector 830, via the wires 861-863 and 864a-c.

The wire 861 may be ground and it may be connected to contact surface 1 on each of the connectors. The wire 862 may implement a multi drop bus, such as a 1-wire bus, for exchanging communications between the sensor boards 210a-h and the control board 230. The wire 862 may be coupled to contact surface 2 on each of the connectors. The wire 863 may be used to carry a power supply to each one of the sensor boards 210a-h and it may be coupled to contact surface 3 on each of the connectors. Each of the wires 861-863 may have one wire segment or, alternatively, each of the wires 861-863 may include a plurality of segments connected to one another, possibly at the different connectors that are part of the cable assembly 220. Furthermore, each of the wires may include one or more strands. Each of the wires 864a-c may be used to carry an ENABLE signal from one sensor board to another. As illustrated, each of the wires 864a-c may couple contact surface 5 of one connector to contact surface 4 of another connector that is part of the cable assembly 220.

In operation, the control board 230 may execute a discovery process in which all sensor boards connected to the control board 230 are identified and registered with the control board 230. After the registration process is complete, the control board 230 may start receiving temperature readings from the sensor boards 210a-h and forward the readings to another device, such as the rack managing unit 150 or the management system 170.

The registration process may begin with the control board 230 asserting an ENABLE signal (logic low) on wire 864a. The ENABLE signal may put the sensor of the sensor board 210a into an ON state. Only when in the ON state, the sensor board 210a (and all other sensor boards) may respond to conditional ROM commands. Throughout the registration process, only one of the sensor boards is in the ON state at a time. After the sensor board 210a is put in the ON state, the control board 230 may issue a conditional ROM command on the I/O bus (wire 862) and the sensor board 210a may respond to that command with a registration number. The control board 230 may store the registration number and issue a DONE command on the I/O bus. The DONE command may put the sensor board 210a out of the ON state and into a DONE state.

When in the DONE state, the sensor board may assert an ENABLE signal (logic low) on wire 864b thereby putting the next sensor board in the chain (sensor board 210b) in the ON state and issue a conditional ROM command. Afterwards, the sensor board may receive registration number from the sensor board 210b, record it, put the sensor board 210b into the DONE state, and proceed in the same manner to obtain the registration number of the next sensor board in the chain. The above steps are repeated until the registration numbers of all sensor boards in the sensor array 250 are obtained. In some aspects, the registration process is facilitated by the wires 864a-c that connect the sensor boards in the array 250 in pairs thus allowing the ENABLE signals to flow from one sensor board to only one other sensor board in the array 250.

Figure 8B:
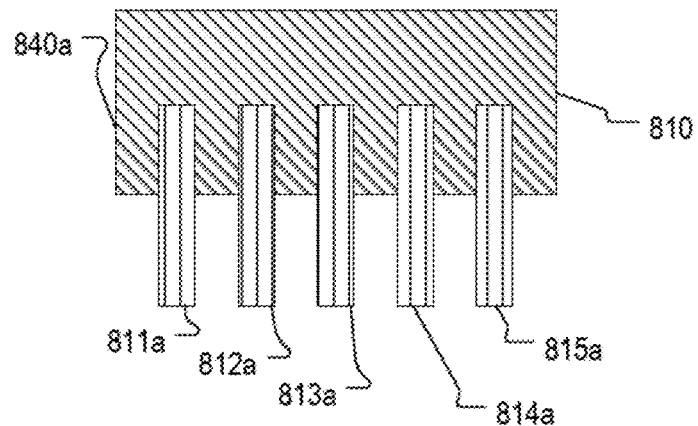
FIGS. 8B-D depict schematic diagrams of connectors that may be used in the sensor array of FIG. 2B.
Figure 8C:
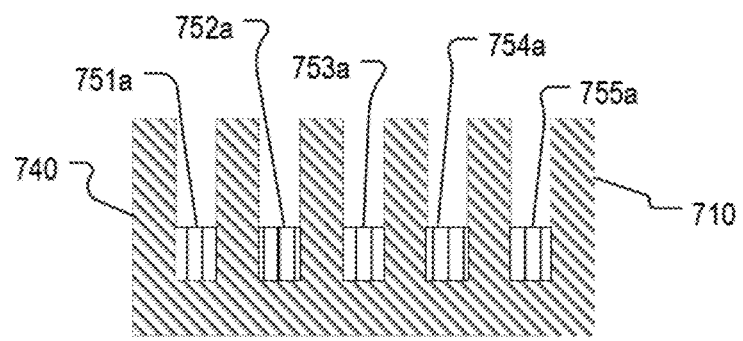
Figure 8D:
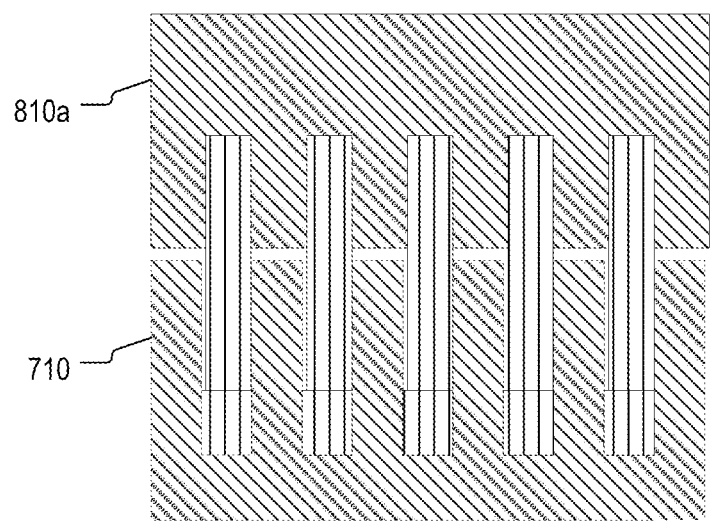

FIG. 8B depicts a schematic diagram of a cross-section of the connector 810 in accordance with aspects of the disclosure. The connector 810 may include a plurality of contact surfaces 811a-815a disposed in a dielectric base 840a. The contact surfaces, in this example, may be metal pins. FIG. 8C depicts a schematic diagram of a cross-section of the connector 710 in accordance with aspects of the disclosure. In this example, the connector 710 may include a plurality of contact surfaces 751a-755a disposed within a dielectric base 740. In this example, the contact surface 751a-755a may be metal plates adapted to form an electric connection with the contact surfaces 811a-815a when the connector 810 is mated with the connector 710 as shown in FIG. 8D. It should be noted that in other examples, the types of the connectors may be switched such that a male connector is found on the control board 230 and a female connector is found in the cable assembly 220. The disclosure is not limited to any specific type of connector being part of the cable assembly 220, the control board 230, or the sensor boards 210a-h.

Figure 8E:
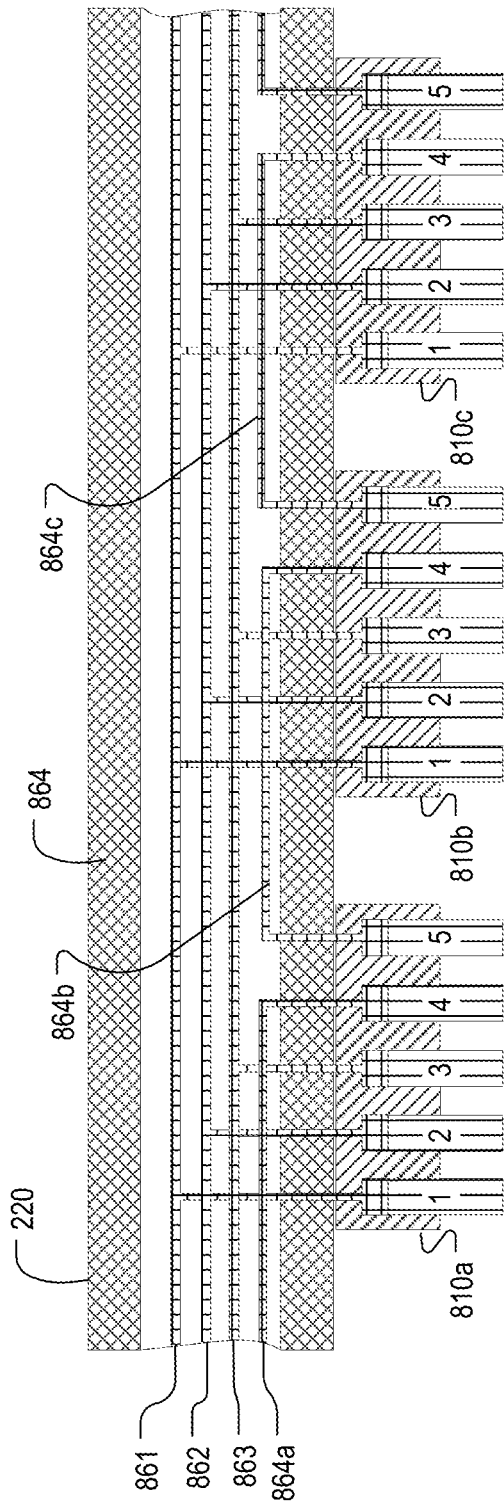
FIG. 8E depicts a schematic diagram of the cross-section of a cable that may be used to wire sensor boards that are part of the sensor array of FIG. 2B.

FIG. 8E depicts a schematic diagram of a cross-section of the cable assembly 220. As illustrated, the wires 861-863 and 864a-c are enveloped in a jacket 864a forming a monolithic piece of cable that may be run inside the enclosures of data center equipment. Using the cable 220 may be advantageous because it allows a large number of sensors to be connected to the control board 230 with a single run of cable. By contrast, using a separate cable to connect each sensor in the array 250 may increase clutter in device enclosures where the sensor array 250 is installed. Moreover, managing multiple cable runs is more difficult as it becomes harder to track which cable goes where and there is an increased potential of cables getting disconnected or otherwise forming bad connections. Using the cable 220, thus increases the maintainability and reliability of the thermal monitoring system.

FIG. 9 depicts an example of one potential use of the sensor array 250 in the data center 100. In this example, the sensor array 250 may be used to monitor the temperature inside device enclosure 910. Device enclosure 910 may be a server rack enclosure, server enclosure (e.g, ATX case, blade server enclosure), battery backup system enclosure, distribution board enclosure, or the enclosure of any other type of device in the data center 100. The sensor array 250 may be installed inside the device enclosure 910 with the sensors 210a-h affixed at different locations in the enclosure. Like the sensor boards, the control board 230 may be also be mounted inside the enclosure 910. The cable 220 may be run along the edges of the enclosure 910 connecting the sensors as a linear network to the control board 230.

FIG. 10 depicts a schematic diagram of a sensor array 1000 in accordance with yet another example. The sensor array 1000 may include sensor boards 1020a-h that are wired as a linear network using the cable 1010. Each of the sensor boards 1020a-h may include a sensor, a capacitor, and a resistor connected in the manner illustrated in the circuit diagram 300 depicted in FIG. 3. Unlike the circuit diagram 300, the sensor boards 1020a-h (as well as the cable 1010) may lack connectors and the cable 1010 may be soldered directly onto the sensor boards 1020a-h. Thus, in that regard, the sensor array 1000 may use fewer parts than the sensor array 250.

Figure 11:
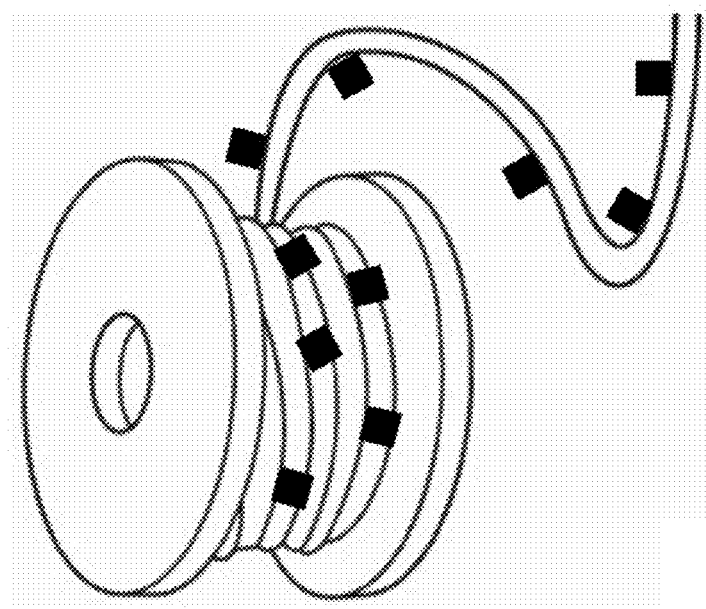
FIG. 11 depicts an example of one possible packaging for the sensor array of FIG. 10.

In some aspects, the sensor array 1000 may be prefabricated to be many meters long and include hundreds of sensor boards. The sensor array 1000 may come rolled in a spool (as depicted in FIG. 11) or in another type of wholesale packaging. At data centers, data center personnel may draw and cut runs of the "sensor cable", route the cut pieces of cable inside equipment enclosures, such as the enclosure 910, crimp a connector at one end of the cable and plug into the connector to control board. Commoditizing the sensor array in such manner may increase the efficiency at which thermal monitoring networks are installed inside the enclosures of equipment in the data center. Instead of going through the motions of placing individual sensors in server enclosures, and then connecting each sensor board with a cable, data center personnel may simply run the "sensor cable" inside equipment enclosures without connecting each sensor board individually.

Figure 12:
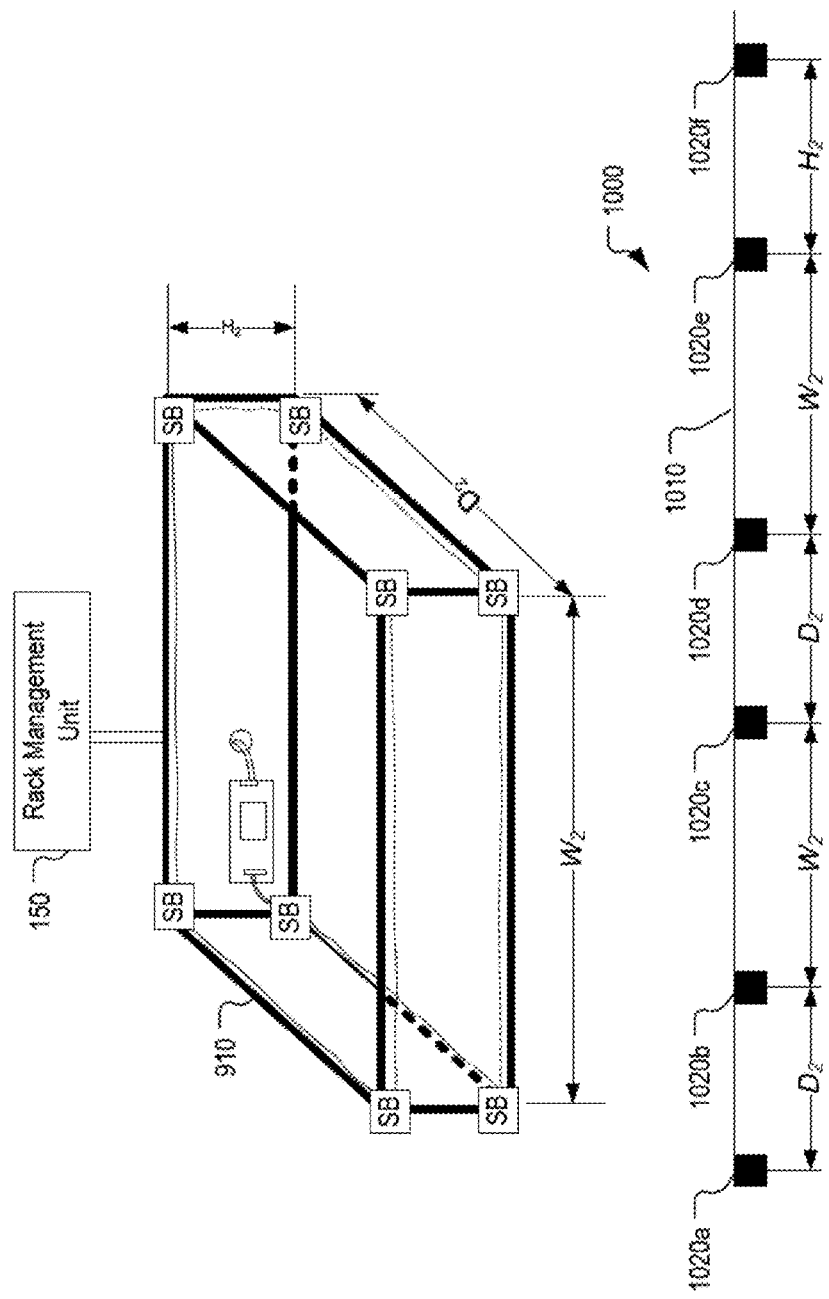
FIG. 12 depicts another schematic diagram of the sensor array of FIG. 10 in accordance with aspects of the disclosure.

Furthermore, in some aspects, the sensors boards in the data sensor array 1000 may be spaced apart in a pattern that is based on one or more dimensions of data center equipment (e.g., device enclosures, server racks), where the sensor array 1000 is intended to be installed. As illustrated in FIG. 12, the distance between two sensor boards in the sensor array 1000 may be based on (e.g., the same as or equal to a fraction of) the length, width, or height of the enclosure 910. Spacing the sensor boards according to the dimensions of the enclosure 910 may enable the sensor boards to fall at predetermined places, when the sensor array 1000 is installed in the enclosure 910. Furthermore, although in this example, the sensors are spaced apart based on the dimensions of an equipment enclosure, in other examples, however, they may be spaced apart based on the distance between designated mounting locations in the enclosure (e.g., pre-drilled mounting holes). It should also be noted, that the cable assembly 220 may also be manufactured with the connectors 810a-h spaced apart in similar patterns. In any event, spacing the sensors (connectors) apart along a cable line, may further increase the efficiency at which sensors are installed in the enclosures of data center equipment.

Figure 13:
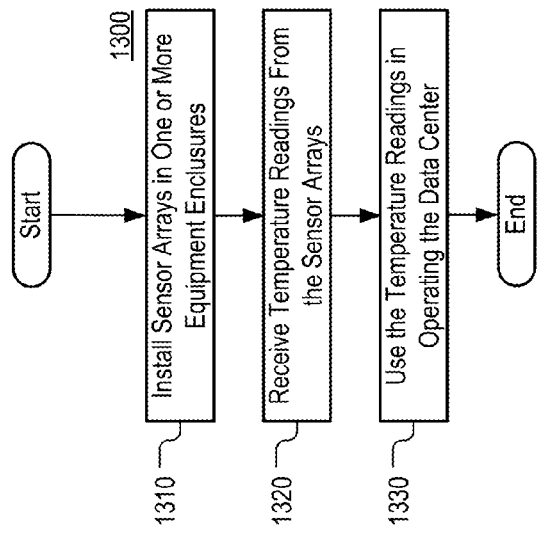
FIG. 13 depicts a flowchart of a process in accordance with aspects of the disclosures.

FIG. 13 depicts a flowchart of a process 1300 for operating the data center 100 based on temperature readings obtained from the sensor boards in the array 250. At task 1310, sensor arrays are installed in one or more equipment enclosures in the data center 100. For example, sensor arrays may be installed inside (or outside) of the enclosures of servers 131-135, cooling systems, battery backup systems, or in the server racks directly. When a sensor array is installed in a server racks, the sensor boards may be mounted on the server rack fixture, such as on shelves in the server rack, under the shelves, or on vertical members that support the shelves. One manner in which the sensor arrays are installed is further discussed with respect to FIG. 14. At task 1320, temperature readings from the installed sensor arrays are obtained. One manner in which the temperature readings are obtained is further discussed with respect to FIG. 15. At task 1330, the operation of the data center is controlled based on the obtained temperature readings. For example, if the temperature readings indicate that the temperature at a given location in the data center is high, extra cooling may be supplied to that location. Conversely, if the temperature readings indicate that the temperature at a given location in the data center is overcooled, the amount of cooling supplied to that portion may be reduced. The amount of cooling supplied to the location may be determined by a control device, such as the rack management unit 150 or the management system 170. By using control logic, the control device may determine rates of operation for the cooling systems and output control signals that set the cooling systems to operate at the determined rates.

Figure 14:
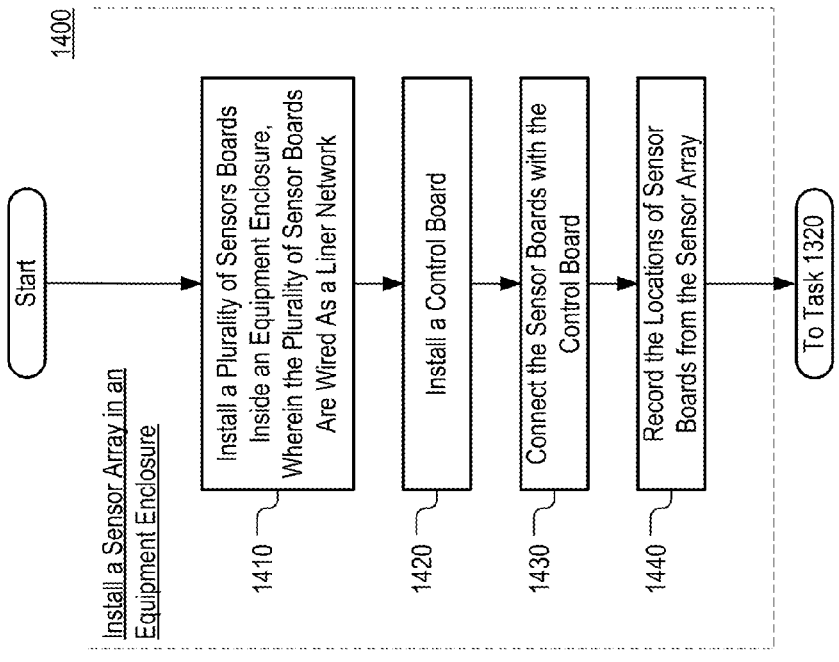
FIG. 14 depicts a flowchart of a process associated with the process of FIG. 13.

FIG. 14 depicts an exemplary flowchart of a process 1400 for installing a sensor array inside an equipment enclosure as specified by task 1310 of FIG. 13. The process 1400 is directed towards the installation of one sensor array in one enclosure, and thus, the process 1400 may be repeated for each piece of equipment that is outfitted with a thermal sensor array at task 1310.

At task 1410 a plurality of sensor boards is mounted in at various locations in an equipment enclosure. At task 1420, a control board is installed either inside or outside of the equipment enclosure. In this example, the control board may be mounted on a wall of the equipment enclosure or outside of the equipment enclosure. At task 1430, the sensor boards are connected to the control board in a liner network as illustrated in FIG. 9. The sensor boards may be connected by using a cable (e.g., cable assembly 220) that is run along the walls of the equipment enclosure. In instances where the sensor boards are integrated with the cable (e.g., sensor array 1000), the sensor array may be installed in one step by simply laying the string of sensor boards inside the equipment enclosure.

At task 1440, the locations of the sensor boards are recorded. In some aspects, the recording may involve storing the locations in a data structure, such as table 752, depicted in FIG. 16, that relates sensor board identifiers to the locations where the sensor boards are placed. Each sensor board identifier may be an ID stored in a register of a sensor that is part of each sensor board, or any other string (or number) capable of identifying the sensor. The location may be expressed as a coordinate in a coordinate system that is local to and used only by the enclosure where the sensors are installed. For example, the coordinate [X,Y,Z] may be used, wherein X is a distance from an origin point in the enclosure along a first axis, Y is a distance from the origin point along a second axis, and Z is a distance from the origin point along a third axis. Alternatively, the locations may be expressed using a coordinate system that originates elsewhere and is also used to denote the location of sensor boards installed in other places in the data center 100. The table may be stored in the memory of a control board of the sensor array (control board 230), the memory of a rack management unit, or the memory of a management system. The table may be stored as part of a database, a text file, or as any other data structure. The table may be received by the control board as user input.

Figure 15:
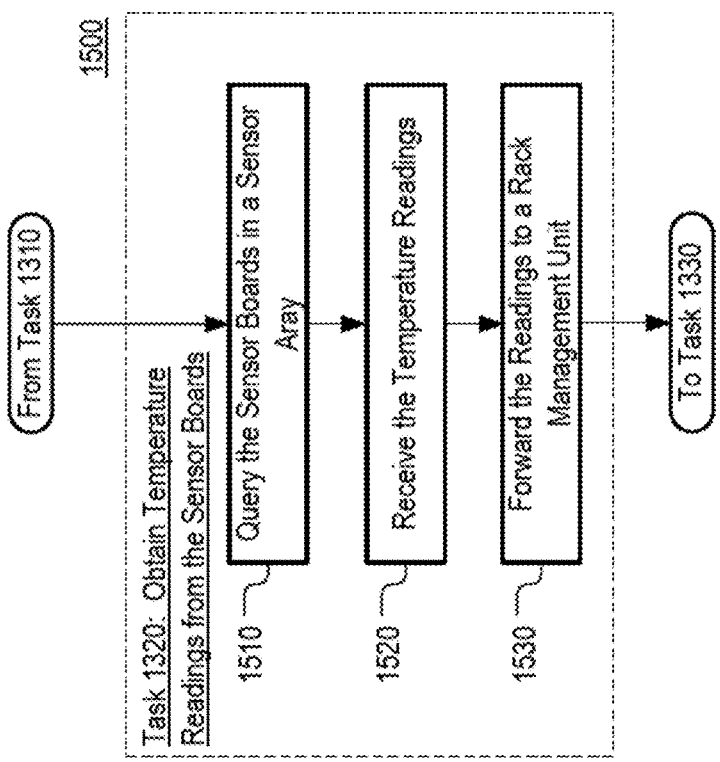
FIG. 15 depicts an example of another process associated with the process of FIG. 14.

FIG. 15 depicts an exemplary flowchart of a process 1500 associated with obtaining temperature readings from the sensor array as specified by task 1330 of FIG. 13. The process 1500 is directed to obtaining temperature readings from a single sensor array, and thus, the process 1500 should be repeated for each sensor array installed at task 1310. At task 1510, the control board of the sensor array requests temperature readings from one or more sensor boards in the sensor array. At task 1520, the control board receives temperature readings from the queried sensors. At task 1530, the control board transmits an indication of each of the temperature received at task 1420 to a rack management unit (e.g., rack management unit 150) or another device. The control board may transmit each of the readings in a separate message or it may transmit all sensor readings in a single message.

In one example, the message(s) containing the temperature readings by the control board may include one or more indications of location. The indications of location may identify the locations where each of the temperature readings are taken and they may inform that system(s) that control of the operation of the data center of the temperature of various locations in the data center. The locations may be indicated explicitly, by using one or more coordinates, or alternatively, the locations may be indicated implicitly based on the order in which sensor readings are arranged in a single message or the order in which messages are transmitted. Furthermore, instead of coordinates, the indications of location may include identifiers of sensor boards that took the temperature measurements. In such instances, the recipient devices of the messages (e.g., rack management unit 150 or the management system 170) may determine the locations where the sensor boards are mounted by consulting a table, such as the table 752.

Figure 17:
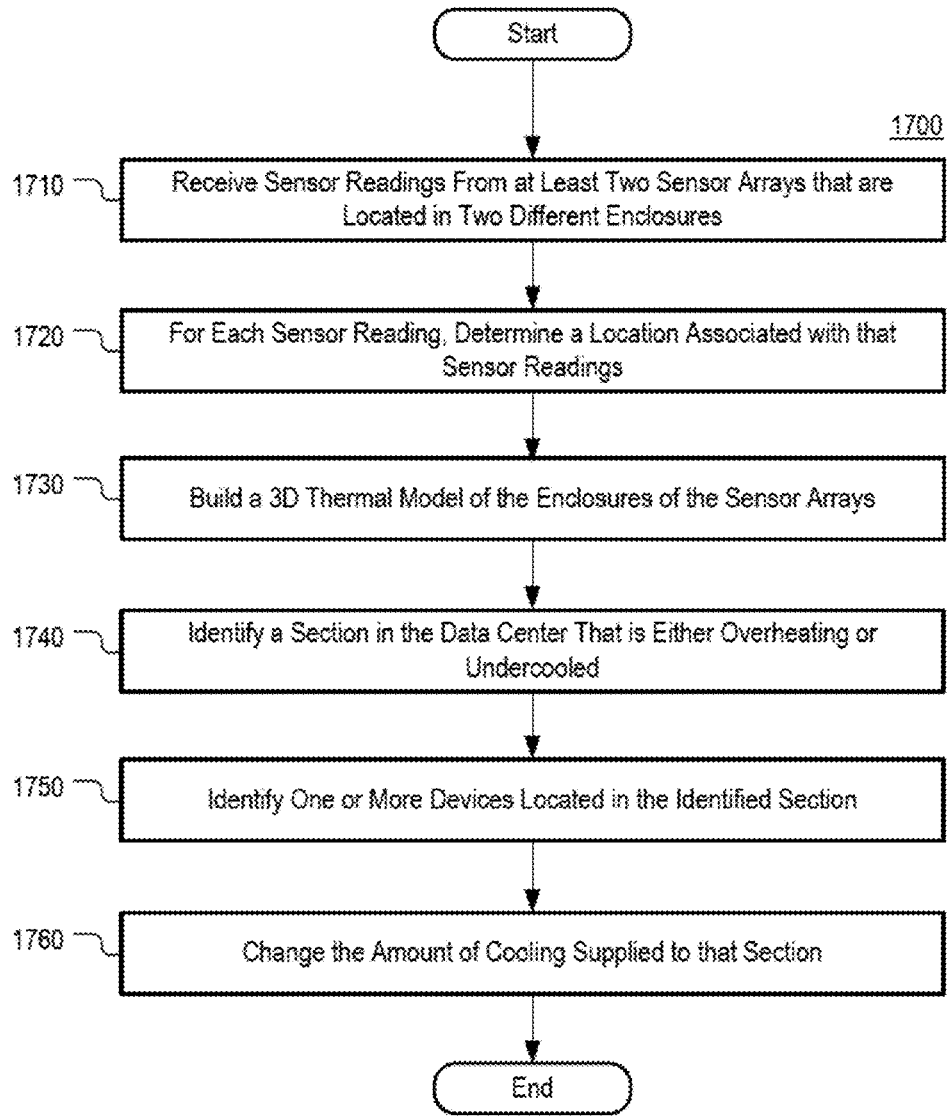
FIG. 17 depicts a flowchart of another process in accordance with aspects of the disclosure.

FIG. 17, depicts a flowchart of a process 1700 associated with using information from one or more sensor arrays installed in the data center 100. The process 1700 may be executed by the management system 170, the RMU 150, or any other system. At task 1710, sensor readings are obtained from a plurality of sensor arrays. In this example, sensor readings are obtained from the sensor arrays located in the enclosures of devices in the server racks 110a-c, such as the servers 131-135 or servers in the racks 110b-c. At task 1720, the managing terminal 170 determines, for each sensor reading, a location associated with that sensor reading. The location associated with each sensor readings may be the location of the sensor that took the reading (e.g., front left corner of the enclosure 910). As discussed above, the locations may be indicated implicitly or explicitly in messages received from the control boards associated with the sensor arrays. At task 1730, a three-dimensional thermal map (model) of the server racks 110a-c is constructed. In constructing the thermal map, all sensor readings from the plurality of sensor arrays may be consolidated into a single table, or another data structure. The table may relate each sensor reading with the location of the sensor that took that reading. In some aspects, constructing the thermal map may be similar to putting together the pieces of a puzzle. Because the sensor measurements from each sensor array indicate the thermal state of an enclosure where the sensor array is mounted, the combination of the sensor readings from multiple sensor array indicates the thermal state of a collection of enclosures, such as a server rack or a row of server racks. In this example, a thermal map 1810 (shown in FIG. 18) is created.

At task 1740, an area in the thermal map is identified having temperature is within a predetermined range. By way of example, the range may include all values below or above a threshold (e.g., 25° C.) or all values within a range (e.g., 20° C.-30° C.). In this example, the hot spot 1910 (shown in FIG. 19) is identified.

At task 1750, one or more devices (e.g., servers) that are located in the area determined at task 1740 (e.g., the hot spot 1910) are identified. The devices may be identified based on a table that relates the devices locations within the data center with the devices' identifiers. In this example, the servers 134 and 135 are identified. At task 1760, the amount of cooling supplied to the identified devices is adjusted. In this example, the amount of cooling is increased, but instances where the devices are overcooled, the amount of cooling may be decreased. For example, cooling devices located in the server racks 110a-b may be turned up, or alternatively, air conditioners in the data center that are responsible for cooling 1 location where the hot spot 1910 (shown in FIG. 19) is situated may be activated.

Figure 19:
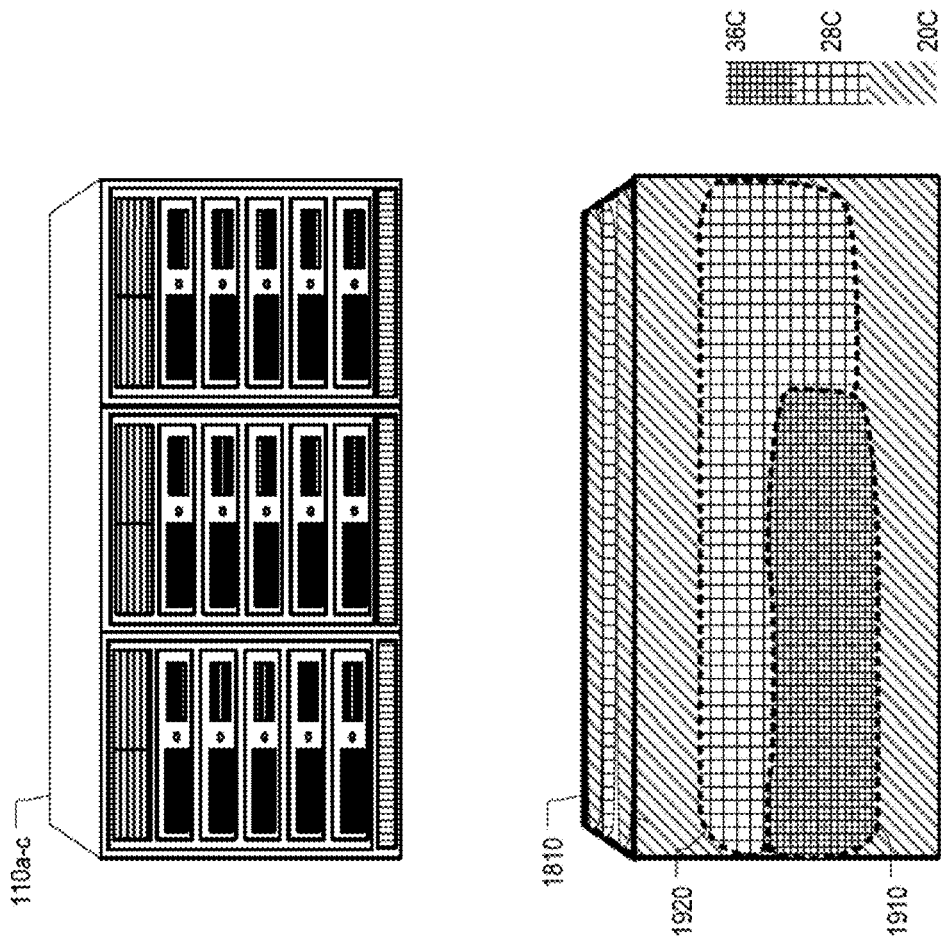
FIG. 19 depicts a 3D representation of the thermal map of FIG. 18.

FIG. 18 depicts a tabular representation of the thermal map 1810. As illustrated, the table relates temperature readings with the location of the sensors that took the readings. Some of the data in the table, in some instances, may be derived by interpolating the sensor readings. FIG. 19 depicts a graphical representation of the thermal map 1810. As illustrated, the graphical representation of the thermal map 1810 shows the distribution of heat across the surface of the server racks 110a-c. Specifically, the thermal map 1810 illustrates that a hot sections 1910 and cooler section 1920 may be formed on the surface of the server racks 110a-c. Although in this example, the thermal map 1810 illustrates the thermal state of a single row of server racks, in other examples it may depict the thermal state of multiple rows of server racks, or the thermal state of an individual server rack. Furthermore, in other instances, the thermal map 1810 may show the temperature in the interior of a device enclosure, by using cut-out views or similar visual devices. In that regard, the thermal map 1810 may illustrate a temperature differential between two points in the same enclosure. (e.g., front left corner of the enclosure 910 and rear right corner of the enclosure 910).

FIGS. 1-19 are provided as examples only. In some aspects, at least some of the tasks associated with FIGS. 13-17 may be performed in a different order than represented, performed concurrently, or altogether omitted. The processes 1300-1700 may be implemented as software that is executed by the management system 170, in hardware (e.g., FPGA) or both software and hardware. Tasks associated with the process 1300-1400 may be performed at the control board 230, the rack management unit 150, and/or the control system 150. Although in the above 1 examples, only thermal sensors are discussed, it should be understood that other types of sensors may be used instead.

In some aspects, the connector mounted on the control board may be connector part number 3-641193-3 manufactured by Tyco. The connector on the cable connecting to the control board may be connector part number 3-647167-3 manufactured by Tyco. The connector on the cable 220 may be a connector part number SHR-05V-S-B with crimp part number JST SSH-003T-P0.2 both manufactured by Japanese Solderless Terminals. The connectors on the sensor boards may be JST BM058-SRSS-TB manufactured by Japanese Solderless Terminals. The wires 861-863 and 864a-c may be 28AWG wires. The wires 861 and 862 may be twisted at a rate 50-65 turns. Each wire may be a multi-strand wire or a single-strand wire.

Although in the above examples, the sensor array 250 is deployed in a data center equipment enclosure, in other examples, it may be deployed in any other environment whose temperature needs to be monitored. In that regard, the control board 230 may be connected to any computing device and not just a rack management unit. As these and other variations and combinations of the features discussed above can be utilized without departing from the subject matter as defined by the claims, the foregoing description of exemplary aspects should be taken by way of illustration rather than by way of limitation of the subject matter as defined by the claims. It will also be understood that the provision of the examples described herein (as well as clauses phrased as "such as," "e.g.", "including" and the like) should not be interpreted as limiting the claimed subject matter to the specific examples; rather, the examples are intended to illustrate only some of many possible aspects.

The invention claimed is:

1. A data center comprising:
a control device configured to monitor temperatures of one or more devices in the data center;
a sensor control board that is operatively connected to the control device;
a device enclosure for the one or more devices; and
a plurality of sensor boards disposed within the device enclosure and connected to the sensor control board, the sensor boards in the plurality being connected in series to one another using a single run of cable;
wherein the sensor control board is configured to receive temperature readings from the plurality of sensor boards and forward those readings to the control device; and
wherein, during registration of the plurality of sensor boards, only one of the plurality of sensor boards is in an ON state at a time, the only one of the plurality of sensor boards in the ON state being enabled by a signal from an immediately preceding sensor board of the plurality of sensor boards through the single run of cable, and the only one of the plurality of sensor boards being configured to supply a registration number only to the immediately preceding sensor board.

2. The data center of claim 1, wherein the one or more devices include at least one of a server, a battery backup system, or a power distribution board.

3. The data center of claim 1, wherein the sensor control board is disposed inside the device enclosure.

4. The data center of claim 1, further comprising a server rack, wherein the one or more devices are housed in the server rack.

5. The data center of claim 1, wherein the control device includes a rack management unit.

6. The data center of claim 1, wherein the control device includes a management system.

7. The system of claim 1, wherein each one of the sensor boards includes a substrate base that is less than 1.5 mm thick that enables the sensor board to have a low thermal mass.

8. A system for monitoring the temperature of data center equipment comprising:
a control device;
a cable;
a plurality of sensor boards connected in series to one another via the cable, the sensor boards being spaced apart from one another, along the cable, in a pattern that depends on distances between positions in a device enclosure that are designated for mounting of the sensor boards; and
a sensor control board including a memory configured to store indications of locations where the sensor boards are mounted, and a processor configured to receive temperature readings from the plurality of sensor boards and forward the temperature readings to the control device along with an indication of location for each sensor reading that corresponds to a location of a sensor that took that reading;

wherein, during registration of the plurality of sensor boards, only one of the plurality of sensor boards is in an ON state at a time, the only one of the plurality of sensor boards in the ON state being enabled by a signal from an immediately preceding sensor board of the plurality of sensor boards through the cable, and the only one of the plurality of sensor boards being configured to supply a registration number only to the immediately preceding sensor board.

9. The system of claim 8, wherein each one of the sensor boards includes a substrate base that is less than 1.5 mm thick thereby enabling the sensor board to have a low thermal mass.

10. The system of claim 8, wherein the cable is soldered onto the sensor boards.

11. The system of claim 8, wherein the cable includes a plurality of wires, each wire being coupled to only two sensor boards from the plurality of sensor boards.

12. The system of claim 8, wherein the locations where the sensor boards are mounted are entered as user input into the sensor control board.

13. The system of claim 8, wherein forwarding the temperature readings to the control device includes identifying, for each of the sensor readings, a location where a sensor board that took the reading is mounted.

14. A system comprising a sensor control board coupled to a plurality of sensor boards, the sensor control board and the plurality of sensor boards being connected in series to one another via a single cable, wherein the cable includes:
    a jacket;
    a plurality of connectors;
    a first wire disposed within the jacket and coupled to all connectors in the plurality of connectors, the first wire being used as a data bus for the exchange of data between the sensor control board and the plurality of sensor boards;
    a second wire disposed within the jacket and coupled to only two connectors from the plurality of connectors, the second wire being coupled to a first one from the plurality of connectors and a second one from the plurality of connectors, wherein:
the first one of the plurality of connectors is configured to mate with a first sensor board of the plurality of sensor boards and transfer a signal that is output by the first sensor board onto the second wire,
the second one of the plurality of connectors is configured to mate with a second sensor board of the plurality of sensor boards,
the signal is a signal that enables a registration of the second sensor board with the sensor control board, and
wherein, during the registration of the second sensor board, only the second sensor board is in an ON state, and the second sensor board is configured to supply a registration number only to the first sensor board.

15. The system of claim 14, wherein:
the cable further comprises a plurality of wires disposed within the jacket, the plurality of wires being different from the first wire and the second wire; and
each one of the plurality of wires being coupled to only two connectors from the plurality of connectors.

16. The system of claim 14, wherein each one of the plurality of sensor boards includes a thermal sensor.

17. The system of claim 14, wherein at least one of the plurality of sensor boards comprises a substrate base that is less than 1.5 mm thick that enables the sensor board to have a low thermal mass.

18. The system of claim 14, wherein the sensor control board is configured to receive temperature readings from the plurality of sensor boards.

19. The system of claim 14, wherein the sensor control board is configured to store an indication of a location where at least one of the sensor boards is mounted.

20. The system of claim 14, wherein the sensor control board is configured to:
    receive temperature readings from a sensor board in the plurality of sensor boards;
    store in a memory an indication of a location where the sensor board is mounted; and
    transmit the temperature reading and the indication of location to a control device.

* * * * *